United States Patent
Hashimoto et al.

(10) Patent No.: US 8,663,876 B2
(45) Date of Patent: Mar. 4, 2014

(54) PHOTOMASK BLANK, METHOD OF MANUFACTURING THE SAME, PHOTOMASK, AND METHOD OF MANUFACTURING THE SAME

(75) Inventors: Masahiro Hashimoto, Tokyo (JP); Toshiyuki Suzuki, Tokyo (JP); Hiroyuki Iwashita, Tokyo (JP)

(73) Assignee: Hoya Corporation, Tokyo (JP)

( * ) Notice: Subject to any disclaimer, the term of this patent is extended or adjusted under 35 U.S.C. 154(b) by 168 days.

(21) Appl. No.: 13/201,368

(22) PCT Filed: Feb. 4, 2010

(86) PCT No.: PCT/JP2010/051625
§ 371 (c)(1), (2), (4) Date: Oct. 12, 2011

(87) PCT Pub. No.: WO2010/092899
PCT Pub. Date: Aug. 19, 2010

(65) Prior Publication Data
US 2012/0045713 A1    Feb. 23, 2012

(30) Foreign Application Priority Data
Feb. 13, 2009   (JP) .................................. 2009-030925

(51) Int. Cl.
C23C 16/34    (2006.01)
G03F 1/22    (2012.01)

(52) U.S. Cl.
USPC ............................................................ 430/5

(58) Field of Classification Search
USPC .......... 430/5, 322, 323, 394; 378/35; 428/428, 428/430
See application file for complete search history.

(56) References Cited

U.S. PATENT DOCUMENTS

| | | | |
|---|---|---|---|
| 2004/0110073 A1 | 6/2004 | Kaneko et al. | |
| 2004/0197679 A1 | 10/2004 | Yoshikawa et al. | |
| 2008/0063950 A1* | 3/2008 | Yoshikawa et al. | 430/5 |
| 2010/0092874 A1 | 4/2010 | Nozawa et al. | |

FOREIGN PATENT DOCUMENTS

| | | | |
|---|---|---|---|
| JP | 2002-156742 A | 5/2002 | |
| JP | 2002-258455 A | 9/2002 | |
| JP | 2004-199035 A | 7/2004 | |
| JP | 2004-302078 A | 10/2004 | |
| JP | 2006-195202 A | 7/2006 | |
| JP | 2010-9001 A | 1/2010 | |
| JP | 2010-9038 A | 1/2010 | |

* cited by examiner

Primary Examiner — Stephen Rosasco
(74) Attorney, Agent, or Firm — Sughrue Mion, PLLC

(57) ABSTRACT

A photomask blank for use in the manufacture of a photomask adapted to be applied with exposure light having a wavelength of 200 nm or less has a thin film on a transparent substrate. The thin film is made of a material containing a transition metal, silicon, and carbon and comprising silicon carbide and/or a transition metal carbide.

14 Claims, 3 Drawing Sheets

PHOTOMASK BLANK, METHOD OF MANUFACTURING THE SAME, PHOTOMASK, AND METHOD OF MANUFACTURING THE SAME

CROSS REFERENCE TO RELATED APPLICATIONS

This application is a National Stage of International Application No. PCT/JP2010/051625 filed on Feb. 4, 2010, which claims priority from Japanese Patent Application No. 2009-030925, filed on Feb. 13, 2009, the contents of all of which are incorporated herein by reference in their entirety.

TECHNICAL FIELD

This invention relates to a photomask blank and a photomask which are improved in irradiation durability, and to methods of manufacturing them. In particular, this invention relates to a photomask blank for use in the manufacture of a photomask to be suitably used in an exposure apparatus using exposure light having a short wavelength of 200 nm or less as an exposure light source, and to such a photomask and methods of manufacturing them.

BACKGROUND ART

Generally, fine pattern formation is carried out by the photolithography in manufacturing processes of a semiconductor device. A number of substrates called photomasks are normally used for this fine pattern formation. The photomask comprises generally a transparent glass substrate having thereon a fine pattern made of a metal thin film or the like. The photolithography is used also in the manufacture of the photomask.

In the manufacture of a photomask by the photolithography, use is made of a photomask blank having a thin film (e.g. a light-shielding film or the like) for forming a transfer pattern (mask pattern) on a transparent substrate such as a glass substrate. The manufacture of the photomask using the photomask blank comprises an exposure process of applying required pattern writing to a resist film formed on the photomask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing (exposure) to the resist film formed on the photomask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the photomask is produced.

For miniaturization of a pattern of a semiconductor device, it is necessary to shorten the wavelength of an exposure light source for use in the photolithography in addition to the miniaturization of the mask pattern formed in the photomask. In recent years, the wavelength of an exposure light source in the manufacture of a semiconductor device has been shortened from a KrF excimer laser (wavelength 248 nm) to an ArF excimer laser (wavelength 193 nm).

As a type of photomask, a halftone phase shift mask is known apart from a conventional binary mask having a light-shielding film pattern made of a chromium-based material on a transparent substrate. This halftone phase shift mask is configured to have a light-semitransmitting film on a transparent substrate. This light-semitransmitting film is made of, for example, a material containing a molybdenum silicide compound or the like and is adapted to transmit light having an intensity that does not substantially contribute to exposure (e.g. 1% to 20% at an exposure wavelength) and to give a predetermined phase difference to this transmitted light. By means of light-semitransmitting portions formed by patterning the light-semitransmitting film and light-transmitting portions formed with no light-semitransmitting film and thus adapted to transmit exposure light, the halftone phase shift mask provides a relationship in which the phase of the light transmitted through the light-semitransmitting portions is substantially inverted with respect to the phase of the light transmitted through the light-transmitting portions (i.e. shifts the phase). As a consequence, the lights having passed near the boundaries between the light-semitransmitting portions and the light-transmitting portions and bent into the others' regions due to the diffraction phenomenon cancel each other out. This makes the light intensity at the boundaries approximately zero to thereby improve the contrast, i.e. the resolution, at the boundaries.

In recent years, there have also appeared a binary mask for an ArF excimer laser using a material containing a molybdenum silicide compound as a light-shielding film, and the like.

PRIOR ART DOCUMENT

Patent Document

Patent Document 1: JP-A-2002-156742
Patent Document 2: JP-A-2002-258455

SUMMARY OF INVENTION

Problem to be Solved by Invention

In the meantime, since the photomask manufacturing cost has been significantly increasing following the pattern miniaturization in recent years, there is an increasing need for a longer lifetime of a photomask.

As a factor for determining the lifetime of a photomask, there is a problem of mask degradation caused by the repeated use of the photomask due to its repeated cleaning. Conventionally, for example, when haze is generated, cleaning is carried out for removing the haze, but a film loss (film dissolution) due to the cleaning cannot be avoided and thus, roughly, the number of times of cleaning determines the mask lifetime. Haze is foreign matter composed mainly of ammonium sulfide and generated on the mask.

Conventionally, in order to improve the irradiation durability of a light-semitransmitting film, for example, a light-semitransmitting film (phase shift film) composed mainly of a metal and silicon is heat-treated in the atmosphere or an oxygen atmosphere at 250 to 350° C. for 90 to 150 minutes (Patent Document 1) or a cap layer composed mainly of a metal and silicon is formed on a light-semitransmitting film (phase shift film) composed mainly of a metal and silicon (Patent Document 2).

The mask lifetime becomes short if the irradiation durability of the light-semitransmitting film is low, but currently, the irradiation durability of the light-semitransmitting film is obtained within the range of the mask lifetime based on the number of times of mask cleaning.

Since the number of times of mask cleaning is reduced due to an improvement to haze in recent years, the period of time of the repeated use of a mask is prolonged and thus the exposure time is prolonged correspondingly, and therefore, a problem of the irradiation durability particularly to short-wavelength light such as an ArF excimer laser has been newly actualized.

The present inventors have elucidated that, in the case of a binary mask having a metal silicide-based light-shielding film, a phenomenon occurs in which the line width changes (increases) due to cumulative irradiation of an ArF excimer laser (wavelength 193 nm) as an exposure light source beyond the conventional period of time of the repeated use of the mask. It has been found out that such a line width change degrades the CD (Critical Dimension) accuracy of the photomask and finally degrades the CD accuracy of a pattern-transferred wafer, thus hindering a further increase in the photomask lifetime.

Further, the present inventors have elucidated that, in the case of a phase shift mask, a phenomenon occurs in which the line width changes (increases) and further the transmittance and the phase difference change due to the irradiation of an ArF excimer laser (wavelength 193 nm) as an exposure light source. In the case of the phase shift mask, such changes in transmittance and phase difference are serious problems that affect the mask performance. If the change in transmittance becomes large, the transfer accuracy is degraded, while if the change in phase difference becomes large, the phase shift effect at the pattern boundaries is difficult to obtain so that the contrast at the pattern boundaries is lowered and thus that the resolution is significantly reduced.

The problem of the mask degradation due to the repeated use of the photomask is significant particularly in the case of a phase shift mask in which a compound of a material containing a transition metal and silicon (transition metal silicide) is used as a material of a light-semitransmitting film. But, also in the case of a binary mask having a light-shielding film made of a material containing a transition metal and silicon or a compound thereof, there arises a problem of degradation in CD accuracy due to a change (increase) in the line width of the light-shielding film.

Therefore, this invention has been made for solving the conventional problems and has an object to provide a photomask blank, a photomask, and methods of manufacturing them, which can improve the irradiation durability of a thin film composed mainly of a metal and silicon when exposure light having a wavelength of 200 nm or less is cumulatively irradiated beyond the conventional period of time of the repeated use of a mask, thereby improving the photomask lifetime.

Means for Solving the Problem

The present inventors have assumed a cause of the degradation of the photomask due to its repeated use becoming notable following the reduction in exposure light source wavelength, as follows. As will be described in Examples, it has been elucidated from the results of tests based on diligent efforts of the present inventors that the effect of this invention is exhibited with a predetermined structure of this invention, and therefore, this invention is not restricted to an assumption described below.

As a result of examining a pattern of a metal silicide-based thin film (thin film composed mainly of a metal and silicon) in a photomask subjected to a change (increase) in line width due to its repeated use, the present inventors have elucidated that, as shown in FIG. 3, a modified layer 2' containing Si, 0, and a little metal (e.g. Mo) is formed on the surface layer side of a metal silicide-based thin film 2 (e.g. MoSi-based film) and that this is one of main causes of a line width change (increase) Δd and changes in transmittance and phase difference.

The reason (mechanism) for the formation of such a modified layer is considered as follows. That is, the conventional sputtered metal silicide-based thin film (e.g. MoSi-based film) structurally has gaps and, even if annealing is carried out after the film formation, the change in the structure of the metal silicide-based thin film (e.g. MoSi film) is small, and therefore, for example, oxygen ($O_2$), water ($H_2O$), and the like in the atmosphere and, further, ozone ($O_3$) and the like produced by reaction of oxygen ($O_2$) in the atmosphere with an ArF excimer laser enter the gaps and react with Si and Mo forming the metal silicide-based thin film (e.g. MoSi-based film) in the course of using the photomask.

That is, when Si and metal M (e.g. Mo) forming the metal silicide-based thin film (e.g. MoSi-based film) are subjected to irradiation of exposure light (particularly short-wavelength light such as an ArF excimer laser) in such an environment, they are excited into a transition state so that Si is oxidized and expanded (because $SiO_2$ is larger in volume than Si) and metal M (e.g. Mo) is also oxidized, thereby forming the modified layer on the surface layer side of the metal silicide-based thin film (e.g. MoSi-based film). In this event, the quality of a Si oxide film formed largely differs depending on the amount of water (humidity) in the atmosphere and, as the humidity increases, the Si oxide film with a lower density is formed. In the case where the photomask is repeatedly used in the environment where the low-density Si oxide film is formed, while being cumulatively subjected to the irradiation of the exposure light, the oxidation and expansion of Si further proceed and metal M (e.g. Mo) oxidized at the interface between the bulk and the modified layer diffuses in the modified layer to be deposited on a surface thereof and sublimated as, for example, an oxide of metal M (e.g. $MoO_3$). Accordingly, the modified layer is further reduced in density and thus is in a state where it is easily oxidized. As a result, it is considered that the thickness of the modified layer gradually increases (the occupation ratio of the modified layer in the metal silicide-based thin film (e.g. MoSi film) increases).

This phenomenon of the formation and enlargement of the modified layer triggers oxidation reactions of Si and metal M (e.g. Mo) forming the metal silicide-based thin film (e.g. MoSi film) and is significantly observed in the case where short-wavelength exposure light such as an ArF excimer laser having energy necessary for exciting these constituent atoms into a transition state is irradiated on the metal silicide-based thin film for an extremely long time. Such a phenomenon is not limited to the MoSi-based material, but also applies to a light-semitransmitting film made of a material containing another transition metal and silicon. Further, this also applies to a binary mask having a light-shielding film made of a material containing a transition metal and silicon.

Based on the elucidated fact and consideration described above, the present inventors have paid attention to suppressing the oxidation of a thin film such as a metal silicide-based thin film (e.g. MoSi film) as a measure for suppressing the formation and enlargement of a modified layer and, as a result of further continuing intensive studies, have completed this invention.

Specifically, in order to solve the above-mentioned problems, this invention has the following structures.

(Structure 1)

A photomask blank for use in the manufacture of a photomask adapted to be applied with exposure light having a wavelength of 200 nm or less, wherein the photomask blank has a thin film on a transparent substrate, and the thin film is made of a material containing a transition metal, silicon, and carbon and comprising silicon carbide and/or a transition metal carbide.

(Structure 2)

A photomask blank for use in the manufacture of a photomask adapted to be applied with exposure light having a wavelength of 200 nm or less, wherein the photomask blank has a thin film on a transparent substrate, and the thin film is made of a material containing a transition metal, silicon, and hydrogen and comprising silicon hydride.

(Structure 3)

A photomask blank manufacturing method for use in the manufacture of a photomask adapted to be applied with exposure light having a wavelength of 200 nm or less, the method comprising a step of forming a thin film on a transparent substrate, wherein the thin film is formed by sputtering using a target containing carbon or an atmospheric gas containing carbon, the thin film containing a transition metal, silicon, and carbon and comprising silicon carbide and/or a transition metal carbide.

(Structure 4)

A photomask blank manufacturing method for use in the manufacture of a photomask adapted to be applied with exposure light having a wavelength of 200 nm or less, the method comprising a step of forming a thin film on a transparent substrate, wherein the thin film is formed by sputtering using an atmospheric gas containing hydrogen, the thin film containing a transition metal, silicon, and hydrogen and comprising silicon hydride.

(Structure 5)

The photomask blank manufacturing method according to the structure 3, wherein the thin film is formed by adjusting the pressure of the atmospheric gas and/or the power in the sputtering.

(Structure 6)

The photomask blank manufacturing method according to any one of structures 1 to 5, wherein the thin film is a light-shielding film.

(Structure 7)

The photomask blank manufacturing method according to any one of structures 1 to 5, wherein the thin film is a light-semitransmitting film.

(Structure 8)

A method of manufacturing a photomask, comprising a step of patterning, by etching, the thin film in the photomask blank according to any one of the structures 1 to 7.

(Structure 9)

A photomask manufactured by using the photomask blank according to any of the structures 1 to 7.

Effect of the Invention

According to this invention, even if an ArF excimer laser is continuously irradiated on a photomask manufactured using a binary mask blank having a metal silicide-based light-shielding film so that the total dose becomes 30 kJ/cm² (corresponding to the use of about 100,000 times of the photomask and corresponding to the use for about three months with a normal frequency of use of the photomask), it is possible to suppress an increase in the line width (CD change) of a light-shielding film pattern to 10 nm or less and preferably 5 nm or less.

According to this invention, even when an ArF excimer laser is continuously irradiated on a photomask manufactured using a phase shift mask blank having a metal silicide-based light-semitransmitting film so that the total dose becomes 30 kJ/cm², it is possible to suppress an increase in the line width (CD change) of a light-semitransmitting film pattern to 20 nm or less and preferably 10 nm or less. Further, changes in optical properties before and after the ArF excimer laser irradiation are such that the change in transmittance can be within 0.60% and the change in phase difference can be within 3.0 degrees. Further, the change in transmittance can be within 0.05% and the change in phase difference can be within 1.0 degree. In this manner, the changes in optical properties are suppressed to be small and the changes on this level do not affect the performance of the photomask.

According to this invention, it is possible to provide a photomask blank, a photomask, and methods of manufacturing them, which can improve the irradiation durability of a thin film such as a light-semitransmitting film to exposure light having a wavelength of 200 nm or less, thereby significantly improving the photomask lifetime.

In the half-pitch (hp) 32 nm generation according to the semiconductor device design rule, it is necessary to set the CD control to 2.6 nm or less on a wafer. For this, the CD change required for a photomask for use in the hp 32 nm generation is preferably suppressed to 5 nm or less.

MODE FOR CARRYING OUT THE INVENTION

Figure 1:
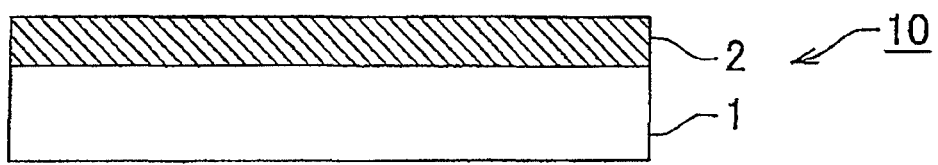
FIG. 1 is a sectional view of a photomask blank according to an Example of this invention.

As in the above-mentioned Structure 1, this invention is a photomask blank for use in the manufacture of a photomask adapted to be applied with exposure light having a wavelength of 200 nm or less, wherein the photomask blank has a thin film on a transparent substrate, and the thin film is made of a material containing a transition metal, silicon, and carbon and comprising silicon carbide and/or a transition metal carbide.

According to this invention, the oxidation of Si is prevented by the silicon carbide. It is considered that the oxidation of Si is prevented by the formation of the silicon carbide, which is difficult to oxidize, in the film during sputtering. Further, it is considered that the oxidation of Si is prevented by the formation of stable Si—C bonds in the film during sputtering.

During the film formation, various bonding states are formed in the thin film, but the silicon carbide or Si—C bonds are not always formed.

According to this invention, the oxidation and migration of the transition metal (M) are suppressed by the transition metal carbide. It is considered that the oxidation and migration of the transition metal (M) are prevented by the formation of the transition metal carbide, which is difficult to oxidize, in the film during sputtering. Further, it is considered that the oxidation and migration of the transition metal (e.g. Mo) are suppressed by the formation of stable M-C bonds in the film during sputtering.

During the film formation, various bonding states are formed in the thin film, but the transition metal carbide or M-C bonds (e.g. Mo—C bonds) are not always formed.

This invention uses the thin film containing carbon in the form of the silicon carbide and/or the transition metal carbide in the thin film containing the transition metal, silicon, and carbon.

In this invention, since the oxidation of Si is prevented and/or the oxidation and migration of the transition metal (e.g. Mo) are suppressed, even if the photomask is repeatedly used with short-wavelength light, such as an ArF excimer laser, having a wavelength of 200 nm or less as an exposure light source so that the exposure light with the wavelength of 200 nm or less is cumulatively irradiated on a thin film pattern of the photomask beyond the conventional period of time of the repeated use, it is possible to suppress changes in the transfer characteristics of the thin film pattern such as, for example, a change in the line width thereof and changes in the transmittance and phase difference of a light-semitransmitting film.

As in the above-mentioned Structure 2, this invention is a photomask blank for use in the manufacture of a photomask adapted to be applied with exposure light having a wavelength of 200 nm or less, wherein the photomask blank has a thin film on a transparent substrate, and the thin film is made of a material containing a transition metal, silicon, and hydrogen and comprising silicon hydride.

According to this invention, the oxidation of Si is prevented by the silicon hydride. It is considered that the oxidation of Si is prevented by the formation of the silicon hydride, which is difficult to oxidize, in the film during sputtering. Further, it is considered that the oxidation of Si is prevented by the formation of anti-oxidation Si—H bonds during sputtering. Since the hydrogen content does not change even if an ArF excimer laser is irradiated on the thin film containing the silicon hydride, it is considered that the Si—H bonds are formed in the sputtering before the ArF excimer laser irradiation.

During the film formation, various bonding states are formed in the thin film, but the silicon hydride or Si—H bonds are not always formed.

This invention uses the thin film containing hydrogen in the form of the silicon hydride in the thin film containing the transition metal, silicon, and hydrogen.

In this invention, since the oxidation of Si is prevented, even if the photomask is repeatedly used with short-wavelength light, such as an ArF excimer laser, having a wavelength of 200 nm or less as an exposure light source so that the exposure light with the wavelength of 200 nm or less is cumulatively irradiated on a thin film pattern of the photomask, it is possible to suppress changes in the transfer characteristics of the thin film pattern such as, for example, a change in the line width thereof and changes in the transmittance and phase difference of a light-semitransmitting film.

In this invention, if the thin film containing the transition metal, silicon, and carbon and/or hydrogen satisfies any one of the following conditions (1) to (3) or a combination thereof [(1)+(2), (1)+(3), (2)+(3), or (1)+(2)+(3)], the irradiation durability is improved so that even if exposure light having a wavelength of 200 nm or less is cumulatively irradiated beyond the conventional period of time of the repeated use (a modified layer is substantially formed), changes in transfer characteristics due to the modified layer and the like can be suppressed as shown in the following (4) and (5). Further, according to this invention, the functions and effects shown in the following (6) and (7) can be obtained.

[Conditions]

(1) The thin film is made of a material comprising silicon carbide.

(2) The thin film is made of a material comprising a transition metal carbide.

(3) The thin film is made of a material comprising silicon hydride.

[Mask CD Change]

(4) The CD change of a light-shielding film pattern can be suppressed to 1 to 10 nm or less and preferably 1 to 5 nm or less.

(5) The CD change of a light-semitransmitting film pattern can be suppressed to 1 to 20 nm or less, preferably 1 to 10 nm, and more preferably 1 to 5 nm or less. With respect to changes in the optical properties of the light-semitransmitting film pattern, the change in transmittance can be suppressed to 0.05 to 0.60% or less and the change in phase difference can be suppressed to 1.0 to 3.0 degrees or less.

Figure 3:
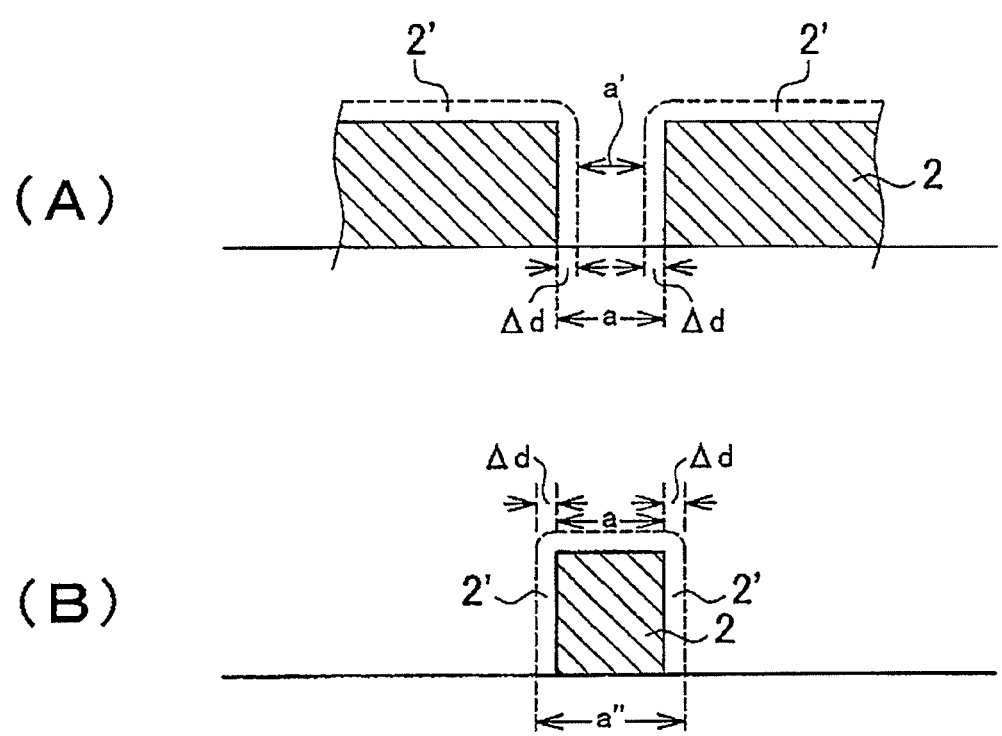
FIG. 3 is exemplary diagrams each for explaining an increase in the line width of a thin film pattern due to a modified layer formed in a thin film of a photomask.

As shown in FIG. 3, assuming that the thickness of a modified layer 2' formed in a surface layer of a thin film pattern 2 is $\Delta d$, the CD change of the thin film pattern referred to in this invention is defined as $2\Delta d$.

FIG. 3, (A) shows the case of a space pattern, wherein CD change=a-a'=$2\Delta d$.

FIG. 3, (B) shows the case of a line pattern, wherein CD change=a"-a=$2\Delta d$.

[Function and Effect]

(6) In this invention, since the etching rate increases due to the presence of C and/or H (silicon carbide, transition metal carbide, silicon hydride), it is not necessary to increase the thickness of a resist film so that the resolution and the pattern accuracy are not degraded. Further, since the etching time can be shortened, in the case of a structure having an etching mask film on a light-shielding film, it is possible to reduce damage to the etching mask film, thus enabling fine patterning.

(7) In this invention, it is possible to suppress precipitation of the transition metal (e.g. Mo) and thus to prevent deposits on the glass substrate or the film due to the precipitation of the transition metal (e.g. Mo). As a consequence, it is possible to suppress defects due to the deposits.

In this invention, when the thin film comprises two layers or more, C and/or H (silicon carbide, transition metal carbide, silicon hydride) may be contained in each layer (all the layers) or C and/or H (silicon carbide, transition metal carbide, silicon hydride) may be contained only in an arbitrary layer/layers of the plurality of layers.

In this invention, the transition metal (M) comprises any one of molybdenum (Mo), tantalum (Ta), chromium (Cr), tungsten (W), titanium (Ti), zirconium (Zr), vanadium (V), niobium (Nb), nickel (Ni), and palladium (Pd) or an alloy thereof.

The chemical state in the thin film containing the transition metal, silicon, and carbon and/or hydrogen according to this invention contains M (transition metal)-Si bonds, Si—Si bonds, M-M bonds, M-C bonds, Si—C bonds, and Si—H bonds.

In the thin film containing the transition metal, silicon, and carbon and/or hydrogen according to this invention, the content of the transition metal M is 1 to 50 at % and preferably 4 to 40 at % in the case of the thin film being a light-shielding film and is 1 to 25 at % and preferably 1 to 15 at % in the case of the thin film being a light-semitransmitting film.

In the thin film containing the transition metal, silicon, and carbon and/or hydrogen according to this invention, the silicon content is 30 to 95 at % and preferably 50 to 80 at % in the case of the thin film being a light-shielding film and is 20 to 60 at % and preferably 30 to 60 at % in the case of the thin film being a light-semitransmitting film.

In the thin film containing the transition metal, silicon, and carbon and/or hydrogen according to this invention, if the content of the transition metal is high (in this case, the silicon content becomes relatively low), deposits on the glass substrate or the film due to precipitation of the transition metal tend to increase. Accordingly, the ratio of the transition metal and silicon is determined taking this into account.

From this point of view, the atomic ratio of the transition metal and silicon is preferably 1:1 to 1:24 and more preferably 1:4 to 1:15 in the case of the thin film being a light-shielding film. In the case of the thin film being a light-semitransmitting film, it is preferably 1:1.5 to 1:24 and more preferably 1:2 to 1:12.

In the thin film containing the transition metal, silicon, and carbon and/or hydrogen according to this invention, the carbon content is 1 to 20 at % and preferably 2 to 10 at % in the case of the thin film being a light-shielding film and is 1 to 20 at % and preferably 2 to 10 at % also in the case of the thin film being a light-semitransmitting film.

In the case where the carbon content of the light-shielding film is less than 1 at %, the silicon carbide and/or the transition metal carbide are/is difficult to form, while in the case where the carbon content exceeds 20 at %, it is difficult to reduce the thickness of the light-shielding film. In the case where the carbon content of the light-semitransmitting film is less than 1 at %, the silicon carbide and/or the transition metal carbide are/is difficult to form, while in the case where the carbon content exceeds 20 at %, it is difficult to reduce the thickness of the light-semitransmitting film.

In the thin film containing the transition metal, silicon, and carbon and/or hydrogen according to this invention, the hydrogen content is 1 to 10 at % and preferably 2 to 5 at % in the case of the thin film being a light-shielding film and is 1 to 10 at % and preferably 2 to 5 at % in the case of the thin film being a light-semitransmitting film.

In the case where the hydrogen content of the light-shielding film is less than 1 at %, the silicon hydride is difficult to form, while in the case where the hydrogen content exceeds 10 at %, it is difficult to form the film. In the case where the hydrogen content of the light-semitransmitting film is less than 1 at %, the silicon hydride is difficult to form, while in the case where the hydrogen content exceeds 10 at %, it is difficult to form the film.

In the thin film containing the transition metal, silicon, and carbon and/or hydrogen according to this invention, C and/or H (silicon carbide, transition metal carbide, silicon hydride) may be contained constantly (uniformly) in its thickness direction.

In the thin film containing the transition metal, silicon, and carbon and/or hydrogen according to this invention, the content of C and/or H (silicon carbide, transition metal carbide, silicon hydride) may change (so-called composition gradient) in its thickness direction.

In the thin film containing the transition metal, silicon, and carbon and/or hydrogen according to this invention, nitrogen may be contained and the nitrogen content is 0 to 50 at % and preferably 0 to 20 at % in the case of the thin film being a light-shielding film and is 0 to 60 at % and preferably 0 to 50 at % in the case of the thin film being a light-semitransmitting film.

In the thin film containing the transition metal, silicon, and carbon and/or hydrogen according to this invention, oxygen may be contained. However, oxygen easily bonds to form Si—O and Mo—O before Si—C, Mo—C, or Si—H is formed and, therefore, it is better not to add much. The thin film may also be substantially free of oxygen.

When the thin film is a light-shielding film, the oxygen content is preferably 0 to 60 at %. When the light-shielding film is in the form of a plurality of layers comprising an antireflection layer and a light-shielding layer, the oxygen content is 0 to 60 at % in the antireflection layer and is 0 to 20 at % and preferably 0 to 10 at % in the light-shielding layer. When the thin film is a light-semitransmitting film, the oxygen content is preferably 0 to 60 at %.

In this invention, in order to reduce the thickness of a resist film to thereby form a fine pattern, the structure may have an etching mask film on the light-shielding film. This etching mask film is made of a material comprising chromium having etching selectivity (having etching resistance) to etching of the light-shielding film containing the transition metal silicide or comprising a chromium compound in which an element/elements such as oxygen, nitrogen, and carbon is/are added to chromium.

In this invention, the thickness of the resist film is preferably 75 nm or less and the thickness of the etching mask film is preferably 5 nm or more and 15 nm or less. This is because, in relation to shortening the etching time of the etching mask film, the thickness of the Cr-based etching mask film is preferably 5 nm or more and 15 nm or less when the thickness of the resist film is 75 nm or less, in terms of reducing LER (Line Edge Roughness) of a resist pattern.

Likewise, in this invention, the thickness of the resist film is preferably 65 nm or less and the thickness of the etching mask film is preferably 5 nm or more and 10 nm or less.

In this invention, the photomask blank may be a binary mask blank or a phase shift mask blank.

A phase shift mask may be a phase shift mask of the halftone type (tri-tone type), the Levenson type, the auxiliary pattern type, the self-aligned type (edge-enhanced type), or the like.

In one aspect of this invention, the thin film is a light-shielding film (Structure 6 described above).

The light-shielding film may have a single-layer structure or a plural-layer structure.

The light-shielding film may be configured to comprise an antireflection layer.

The light-shielding film may be a composition gradient film.

The light-shielding film may have a three-layer structure comprising a back-surface antireflection layer, a light-shielding layer, and a front-surface antireflection layer.

The light-shielding film may have a two-layer structure comprising a light-shielding layer and a front-surface antireflection layer.

In the case where the light-shielding film has the plural-layer structure, C and/or H (silicon carbide, transition metal carbide, silicon hydride) may be contained in all the layers or C and/or H (silicon carbide, transition metal carbide, silicon hydride) may be contained only in the arbitrary layer such as, for example, the light-shielding layer.

In this invention, the light-shielding film is preferably a transition metal silicide carbide hydride, a transition metal silicide carbide, a transition metal silicide hydride, a transition metal silicide nitride carbide hydride, a transition metal silicide nitride carbide, or a transition metal silicide nitride hydride.

In this invention, the following aspect is included.

A photomask blank for use in the manufacture of a photomask adapted to be applied with exposure light having a wavelength of 200 nm or less, wherein the photomask blank has a light-shielding film on a transparent substrate, the light-shielding film comprises at least three layers, and the light-shielding film comprises a light-shielding layer made of a material containing a transition metal, silicon, and carbon and/or hydrogen and comprising at least one kind of silicon carbide, a transition metal carbide, and silicon hydride, an antireflection layer formed in contact with and above the light-shielding layer and made of a transition metal silicide compound containing at least one of oxygen and nitrogen, and a low reflection layer formed in contact with and below the light-shielding layer and made of a transition metal silicide compound containing at least one of oxygen and nitrogen.

In this invention, when the light-shielding film is formed of molybdenum silicide compounds and has a two-layer structure of a light-shielding layer (MoSi or the like) and a front-surface antireflection layer (MoSiON or the like) or a three-layer structure further comprising a back-surface antireflection layer (MoSiON, MoSiN, or the like) between the light-shielding layer and the substrate, the content ratio of Mo and Si in the molybdenum silicide compound of the light-shielding layer is preferably one of the following A, B, and C.

(A) In terms of the light-shielding properties, Mo is preferably 4% or more and 40% or less (preferably 9% or more and 40% or less, more preferably 15% or more and 40% or less, and further preferably 20% or more and 40% or less).

(B) In terms of the cleaning resistance, the Mo content of the antireflection layer is 0 to 20 at %, preferably 0 to 10 at %, and more preferably 0 to 5 at %.

(C) In terms of the pattern sectional shape control, the etching rate of the antireflection layer and the etching rate of the light-shielding layer should be matched with each other and it is preferable that Mo in the molybdenum silicide light-shielding layer be set to 4% or more and 40% or less and preferably 10% or more and 40% or less with respect to the oxidized and/or nitrided antireflection layer.

According to the above-mentioned structure of this invention, i.e. the light-shielding layer containing molybdenum silicide in which the molybdenum content is 4 at % or more and 40 at % or less, the following functions and effects are obtained.

The following functions and effects are obtained by a reduction in thickness of the light-shielding film (reduction in thickness of a mask pattern).

(a) It is possible to achieve prevention of mask pattern collapse in mask cleaning.

(b) With the reduction in thickness of the light-shielding film, the side wall height of the mask pattern is also reduced and, therefore, the pattern accuracy particularly in the side wall height direction is improved so that the CD accuracy (particularly the linearity) can be enhanced.

(c) With respect to a photomask particularly for use in the hyper-NA (Numerical Aperture) (immersion) generation, it is necessary to reduce the thickness of a mask pattern (reduce the side wall height of the mask pattern) as a shadowing measure and this requirement can be satisfied.

When the Mo content of the light-shielding layer is within the scope of this invention, the following functions and effects are obtained.

(d) As compared with the composition which falls outside the scope of this invention, the perpendicular etching sectional shape is obtained.

The light-shielding film may be a composition gradient film in which the composition in its thickness direction changes continuously or stepwise.

In this invention, in the case where the light-shielding film has a plural-layer structure such as a three-layer structure comprising a back-surface antireflection layer, a light-shielding layer, and a front-surface antireflection layer or a two-layer structure comprising a light-shielding layer and a front-surface antireflection layer, the light-shielding layer made of a molybdenum silicide metal preferably has a thickness of 20 nm to 50 nm or less and more preferably 25 nm to 40 nm. The front-surface antireflection layer and the back-surface antireflection layer each preferably have a thickness of 5 nm to 20 nm and more preferably 7 nm to 15 nm.

In this invention, an etching mask film may be provided on the light-shielding film.

By providing the etching mask film, the thickness of a resist film can be reduced so that a finer pattern can be formed.

In the case where the light-shielding film is made of a transition metal silicide (MSi-based), the etching mask film may be made of a material (Cr-based material) comprising chromium having etching selectivity (having etching resistance) to etching of the light-shielding film or comprising a chromium compound in which an element/elements such as oxygen, nitrogen, and carbon is/are added to chromium.

In the case where the light-shielding film is made of a Cr-based material, the etching mask film may be made of a MSi-based material. In this case, if an antireflection function is given to the etching mask film so that the etching mask film remains, C and/or H (silicon carbide, transition metal carbide, silicon hydride) may be contained in the etching mask film. This invention includes an aspect in which the thin film containing the transition metal, silicon, and carbon and/or hydrogen is an etching mask film.

The Cr-based material has high etching selectivity for a fluorine-based gas with respect to the MoSi-based material. However, since the Cr-based material is not a little subjected to the physical etching influence during etching with the fluorine-based gas and thus is more or less reduced in amount. Accordingly, even if the Cr-based etching mask film is optimized, the thickness of the MoSi-based light-shielding film has an upper limit. When the thickness of the MoSi-based light-shielding film exceeds 60 nm with respect to the effective Cr-based etching mask film thickness, the etching time of dry etching with the fluorine-based gas is prolonged so that the thickness of the Cr-based etching mask film after this dry etching is reduced and thus LER (Line Edge Roughness) of a Cr-based etching mask film pattern is degraded. Therefore, the thickness of the MoSi-based light-shielding film (the total thickness in the case of the two-layer or three-layer structure) is preferably 60 nm or less.

In another aspect of this invention, the thin film is a light-semitransmitting film (Structure 7 described above).

The light-semitransmitting film may have a single-layer structure, a two-layer structure comprising a low-transmittance layer and a high-transmittance layer, or a multilayer structure.

The light-semitransmitting film may be of the high-transmittance type. The high-transmittance type has, for example, a relatively high transmittance of 10 to 40% while the transmittance is normally 1% to less than 10%.

In this invention, the thickness of the light-semitransmitting film is preferably 50 to 150 nm.

This invention includes a photomask and a photomask blank having a light-shielding film (pattern) in addition to a light-semitransmitting film (pattern). In this case, it may be configured that the light-shielding film (pattern) is formed on the upper layer side of the light-semitransmitting film (pattern) or on the lower layer side of the light-semitransmitting film (pattern).

In the case where the light-semitransmitting film is made of a transition metal silicide (MSi-based), the light-shielding film may be made of a material (Cr-based material) comprising chromium having etching selectivity (having etching resistance) to etching of the light-semitransmitting film or comprising a chromium compound in which an element/elements such as oxygen, nitrogen, and carbon is/are added to chromium.

In the case where the light-semitransmitting film and the light-shielding film are made of the same transition metal silicide (MSi-based), an etching stopper film made of a Cr-based material may be provided between the light-semitransmitting film and the light-shielding film.

In this invention, the light-semitransmitting film is preferably a transition metal silicide nitride carbide hydride, a transition metal silicide nitride carbide, or a transition metal silicide nitride hydride.

As in the above-mentioned Structure 3, a photomask blank manufacturing method of this invention is a method of manufacturing a photomask blank for use in the manufacture of a photomask adapted to be applied with exposure light having a wavelength of 200 nm or less, the method comprising a step of forming a thin film on a transparent substrate, wherein the thin film is formed by sputtering using a target containing carbon or an atmospheric gas containing carbon, the thin film containing a transition metal, silicon, and carbon and comprising silicon carbide and/or a transition metal carbide.

Herein, a hydrocarbon gas is, for example, methane ($CH_4$), ethane ($C_2H_6$), propane ($C_3H_8$), butane ($C_4H_{10}$), or the like.

Using the hydrocarbon gas, carbon and hydrogen (silicon carbide, transition metal carbide, silicon hydride) can be introduced into the film.

Using the target containing carbon, only the carbon (silicon carbide, transition metal carbide) can be introduced into the film. In this case, there are included, in addition to an aspect of using a MoSiC target, an aspect of using a Mo target and a Si target one or both of which contain C and an aspect of using a MoSi target and a C target.

As in the above-mentioned Structure 4, a photomask blank manufacturing method of this invention is a method of manufacturing a photomask blank for use in the manufacture of a photomask adapted to be applied with exposure light having a wavelength of 200 nm or less, the method comprising a step of forming a thin film on a transparent substrate, wherein the thin film is formed by sputtering using an atmospheric gas containing hydrogen, the thin film containing a transition metal, silicon, and hydrogen and comprising silicon hydride.

This makes it possible to introduce only hydrogen (silicon hydride) into the film.

This method includes, in addition to an aspect of using a MoSi target, an aspect of using a Mo target and a Si target. When carbon (silicon carbide, transition metal carbide) is caused to be further contained in the film by this method, there are included, in addition to an aspect of using a MoSiC target, an aspect of using a Mo target and a Si target one or both of which contain C and an aspect of using a MoSi target and a C target.

In this invention, as in the above-mentioned Structure 5, the thin film is preferably formed by adjusting the pressure of the atmospheric gas and/or the power in the sputtering.

It is considered that when the pressure of the atmospheric gas is low (in this case, the film formation rate is low), carbides or the like (silicon carbide, transition metal carbide) tend to be formed. Further, it is considered that when the electric power (power) is low, carbides or the like (silicon carbide, transition metal carbide) tend to be formed.

This invention adjusts the pressure of the atmospheric gas and/or the power in the sputtering, thereby forming the carbides or the like (silicon carbide, transition metal carbide) as described above to obtain the above-mentioned functions and effects of this invention.

This invention adjusts the pressure of the atmospheric gas and/or the power in the sputtering, thereby forming stable Si—C bonds and/or stable transition metal M-C bonds in the film during the sputtering to obtain the above-mentioned functions and effects of this invention.

On the other hand, it is considered that when the pressure of the atmospheric gas is high (in this case, the film formation rate is high), carbides or the like (silicon carbide, transition metal carbide) are difficult to form. Further, it is considered that when the electric power (power) is high, carbides or the like (silicon carbide, transition metal carbide) are difficult to form.

In this invention, a heat treatment may be carried out after forming the thin film or after manufacturing the photomask. This is because Si—O bonds are formed in a thin film surface or in pattern side walls so that the chemical resistance is improved.

The heat treatment in an atmosphere containing oxygen at 200° C. to 900° C. is preferably cited. If the heating temperature is less than 200° C., there is a problem that the cleaning resistance and the hot water resistance are reduced. On the other hand, if the heating temperature is higher than 900° C., there arises a possibility of degradation of the thin film itself.

In this invention, ultraviolet irradiation, preferably ArF excimer laser irradiation, may be carried out in advance after forming the film or after manufacturing the mask. This is because silicon carbide and/or a transition metal carbide are further formed so that the irradiation durability is further improved.

The transparent substrate is not particularly limited as long as it has transparency at an exposure wavelength to be used. In this invention, a synthetic quartz substrate, a quartz substrate, and various other glass substrates (e.g. $CaF_2$ substrate, soda-lime glass, aluminosilicate glass, alkali-free glass substrate, low thermal expansion glass substrate, etc.) can be used and, among them, the quartz substrate is particularly suitable for this invention because it has high transparency in the range of ArF excimer laser to shorter wavelengths.

As a method of forming the thin film on the transparent substrate, a sputtering film forming method, for example, is preferably cited, but this invention is not limited to the sputtering film forming method.

A DC magnetron sputtering apparatus is preferably cited as a sputtering apparatus, but this invention is not limited to this film forming apparatus. Another type of sputtering apparatus such as an RF magnetron sputtering apparatus may alternatively be used.

As in the above-mentioned Structure 8, this invention provides a photomask manufacturing method comprising a step of patterning, by etching, the thin film in the above-mentioned photomask blank obtained by this invention.

As the etching in this event, dry etching which is effective for forming a fine pattern is suitably used.

According to such a photomask manufacturing method, there is obtained a photomask which is improved in the irradiation durability of a thin film composed mainly of a metal and silicon when exposure light, such as an ArF excimer laser, having a wavelength of 200 nm or less is cumulatively irradiated beyond the conventional period of time of the repeated use of the mask, and which as a result is significantly improved in the lifetime of the photomask.

As in the above-mentioned Structure 9, a photomask of this invention is manufactured by using the above-mentioned photomask blank according to this invention.

As a consequence, there is obtained a photomask which is improved in the irradiation durability of a thin film composed mainly of a metal and silicon when exposure light, such as an ArF excimer laser, having a wavelength of 200 nm or less is cumulatively irradiated beyond the conventional period of time of the repeated use of the mask, and which as a result is significantly improved in the lifetime of the photomask.

In this invention, for dry-etching the molybdenum silicide-based thin film, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, for dry-etching the chromium-based thin film, it is preferable to use a dry etching gas in the form of a chlorine-based gas or in the form of a mixed gas containing a chlorine-based gas and an oxygen gas. This is because if the chromium-based thin film made of the material containing chromium and the element/elements such as oxygen and nitrogen is dry-etched using the above-mentioned dry etching gas, it is possible to increase the dry etching rate and thus to shorten the dry etching time so that a light-shielding film pattern with an excellent sectional shape can be formed. As the chlorine-based gas for use as the dry etching gas, there can be cited, for example, $Cl_2$, $SiCl_4$, HCl, $CCl_4$, $CHCl_3$, or the like.

EXAMPLES

Hereinbelow, the embodiments of this invention will be described in further detail with reference to Examples.

Example 1

FIG. 1 is a sectional view of a binary mask blank 10 of Example 1.

Using a synthetic quartz glass substrate having a 6-inch square size with a thickness of 0.25 inches as a transparent substrate 1, a MoSiON film (back-surface antireflection layer), a MoSiCH film (light-shielding layer), and a MoSiON film (front-surface antireflection layer) were formed as a thin film 2 (light-shielding film) on the transparent substrate 1.

Specifically, using a mixed target of Mo and Si (Mo:Si=21 mol %:79 mol %), a film made of molybdenum, silicon, oxygen, and nitrogen (Mo: 13.0 at %, Si: 36.3 at %, O: 3.1 at %, N: 47.7 at %) and having a thickness of 7 nm was formed by setting the power of a DC power supply to 3.0 kW in a mixed gas atmosphere of Ar, $O_2$, $N_2$, and He (gas flow rate ratio Ar:$O_2$:$N_2$:He=5:4:49:42) at a gas pressure of 0.2 Pa, thereby forming the MoSiON film (back-surface antireflection layer).

Then, using a target of Mo:Si=21 mol %:79 mol %, a film made of molybdenum, silicon, carbon, and hydrogen (Mo: 19.8 at %, Si: 76.7 at %, C: 2.0 at %, H: 1.5 at %) and having a thickness of 30 nm was formed by setting the power of a DC power supply to 2.0 kW in a mixed gas atmosphere of Ar, $CH_4$, and He (gas flow rate ratio Ar:$CH_4$:He=10:1:50) at a gas pressure of 0.3 Pa, thereby forming the MoSiCH film (light-shielding layer).

Then, using a target of Mo:Si=4 mol %:96 mol %, a film made of molybdenum, silicon, oxygen, and nitrogen (Mo: 2.6 at %, Si: 57.1 at %, O: 15.9 at %, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (front-surface antireflection layer).

The total thickness of the light-shielding film was set to 52 nm. The optical density (OD: Optical Density) of the light-shielding film was 3.0 at the wavelength 193 nm of ArF excimer laser exposure light.

In the manner described above, a binary mask blank of Example 1 was manufactured.

Figure 2:
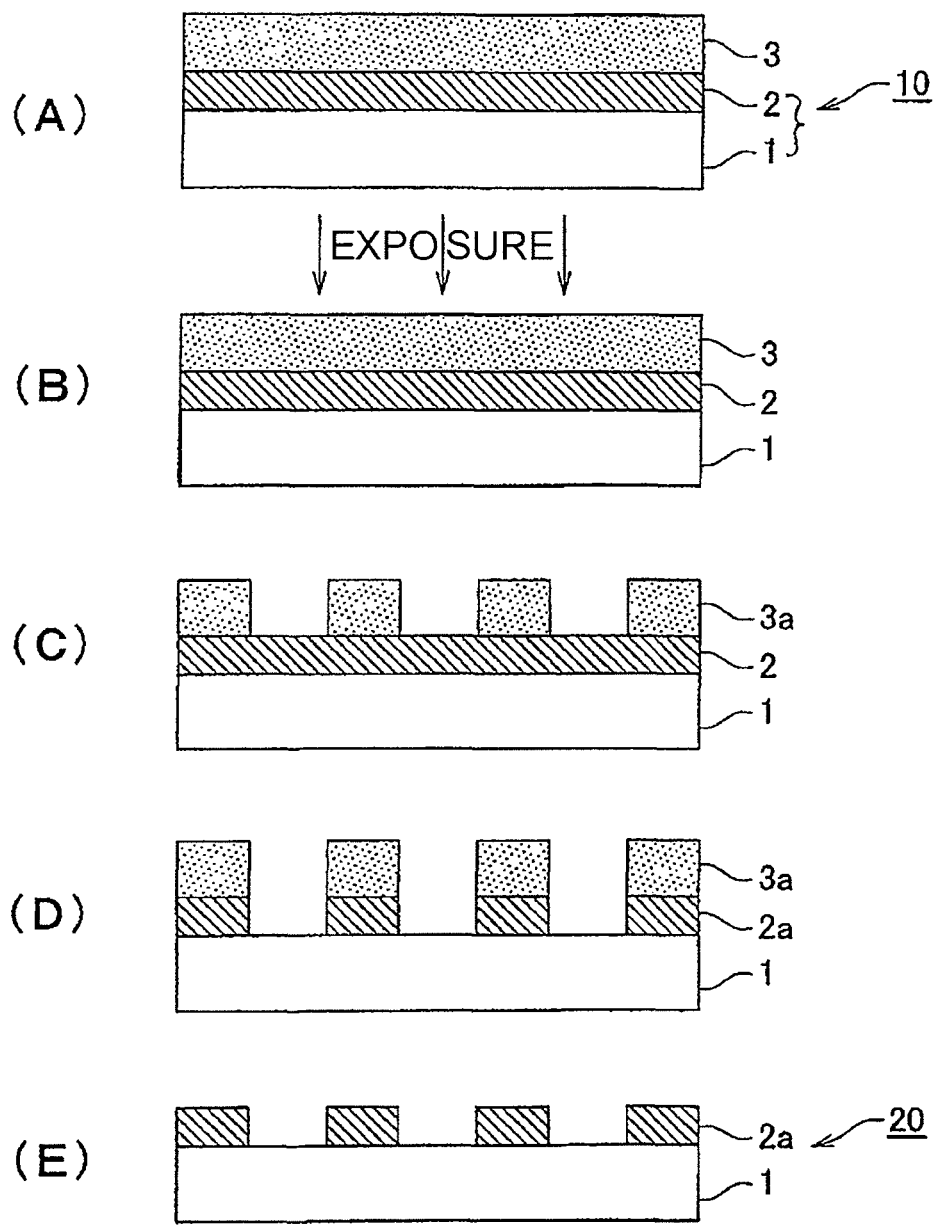
FIG. 2 is sectional views showing processes of manufacturing a photomask using the photomask blank according to the Example of this invention.

Then, a binary mask was manufactured using this binary mask blank. FIG. 2 is sectional views showing processes of manufacturing the binary mask using the binary mask blank.

First, a chemically amplified positive resist film for electron beam writing (PRL009 manufactured by FUJIFILM Electronic Materials Co., Ltd.) was formed as a resist film 3 on the mask blank 10 (see FIG. 2, (A)).

Then, using an electron beam writing apparatus, a required pattern was written on the resist film 3 formed on the mask blank 10 and, thereafter, the resist film 3 was developed with a predetermined developer, thereby forming a resist pattern 3a (see FIG. 2, (B) and (C)).

Then, using the resist pattern 3a as a mask, the thin film 2 in the form of the three-layer structure light-shielding film was etched, thereby forming a light-shielding film pattern 2a (see FIG. 2, (D)). A mixed gas of $SF_6$ and He was used as a dry etching gas.

Then, the remaining resist pattern was stripped, thereby obtaining a binary mask 20 of Example 1 (see FIG. 2, (E)). There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask 20 so that the total dose became 30 kJ/cm$^2$. Herein, the dose of 30 kJ/cm$^2$ (energy density: about 25 mJ/cm$^2$) corresponds to the use of about 100,000 times of a photomask and corresponds to the use for about three months with a normal frequency of use of a photomask.

A section of the light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 2 nm or less. Therefore, it is seen that the binary mask blank and the binary mask of Example 1 have extremely high irradiation durability to cumulative irradiation of an exposure light source with a short wavelength of 200 nm or less.

The binary masks were respectively immersed in an ammonia hydrogen peroxide mixture at 23° C. for 60 minutes and in hot water at 90° C. for 60 minutes, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the ArF excimer laser irradiation, deposits due to precipitation of Mo as conventionally formed were not particularly confirmed on the transparent substrate (glass substrate) or the film.

Example 2

A three-layer structure light-shielding film (MoSiON film (back-surface antireflection layer)/MoSiCH film (light-shielding layer)/MoSiON film (front-surface antireflection layer)) was formed on a transparent substrate in completely the same manner as in Example 1. The total thickness of the light-shielding film and the optical density (OD) of the light-shielding film were approximately the same as those in Example 1 at the wavelength 193 nm of ArF excimer laser exposure light.

Thereafter, a heat treatment was applied to the transparent substrate formed with the light-shielding film. Specifically, using a heating furnace, the heat treatment was carried out in the atmosphere at a heating temperature of 450° C. The contents of C and H in the MoSiCH film (light-shielding layer) of the light-shielding film did not change after the heat treatment. In the manner described above, a binary mask blank of Example 2 was manufactured.

Then, a binary mask was manufactured using this binary mask blank in the same manner as in Example 1.

An ArF excimer laser was continuously irradiated on the obtained binary mask so that the total dose became 30 kJ/cm$^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 2 nm or less. Therefore, it is seen that the binary mask blank and the binary mask of Example 2 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the ArF excimer laser irradiation, deposits due to precipitation of Mo as conventionally formed were not particularly confirmed on the transparent substrate (glass substrate) or the film.

Example 3

Example 3 is the same as Example 1 except that a MoSiON film (back-surface antireflection layer) and a MoSiCH film (light-shielding layer) in a light-shielding film were formed under the following conditions so that the thickness and the Si content of each of the MoSiON film (back-surface antireflection layer) and the MoSiCH film (light-shielding layer) were changed and that the total thickness of the light-shielding film was changed.

Specifically, using a target of Mo:Si=4 mol %:96 mol %, a film made of molybdenum, silicon, oxygen, and nitrogen (Mo: 2.6 at %, Si: 57.1 at %, O: 15.9 at %, N: 24.1 at %) and having a thickness of 7 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (back-surface antireflection layer).

Then, using a target of Mo:Si=4 mol %:96 mol %, a film made of molybdenum, silicon, carbon, and hydrogen (Mo: 3.9 at %, Si: 92.6 at %, C: 2.0 at %, H: 1.5 at %) and having a thickness of 38 nm was formed by setting the power of a DC power supply to 2.0 kW in a mixed gas atmosphere of Ar, $CH_4$, and He (gas flow rate ratio Ar:$CH_4$:He=10:1:50) at a gas pressure of 0.3 Pa, thereby forming the MoSiCH film (light-shielding layer).

Then, using a target of Mo:Si=4 mol %:96 mol %, a film made of molybdenum, silicon, oxygen, and nitrogen (Mo: 2.6 at %, Si: 57.1 at %, O: 15.9 at %, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (front-surface antireflection layer).

The total thickness of the light-shielding film was set to 60 nm. The optical density (OD) of the light-shielding film was 3.0 at the wavelength 193 nm of ArF excimer laser exposure light.

In the manner described above, a binary mask blank of Example 3 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask so that the total dose became 30 kJ/cm$^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 5 nm or less. Therefore, it is seen that the binary mask blank and the binary mask of Example 3 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the irradiation, deposits due to precipitation of Mo as conventionally formed were not particularly confirmed on the transparent substrate (glass substrate) or the film.

Example 4

Example 4 is the same as Example 2 except that a MoSiCH film (light-shielding layer) in a light-shielding film was formed under the following conditions so that the flow rate ratio of a $CH_4$ gas in the film formation and the contents of C and H in the MoSiCH film (light-shielding layer) were changed.

Specifically, using a mixed target of Mo and Si (Mo:Si=21 mol %:79 mol %), a film made of molybdenum, silicon, oxygen, and nitrogen (Mo: 13.0 at %, Si: 36.3 at %, O: 3.1 at %, N: 47.7 at %) and having a thickness of 7 nm was formed by setting the power of a DC power supply to 3.0 kW in a mixed gas atmosphere of Ar, $O_2$, $N_2$, and He (gas flow rate ratio Ar:$O_2$:$N_2$:He=5:4:49:42) at a gas pressure of 0.2 Pa, thereby forming the MoSiON film (back-surface antireflection layer).

Then, using a target of Mo:Si=21 mol %:79 mol %, a film made of molybdenum, silicon, carbon, and hydrogen (Mo:

20.6 at %, Si: 77.4 at %, C: 1.0 at %, H: 1.0 at %) and having a thickness of 30 nm was formed by setting the power of a DC power supply to 2.0 kW in a mixed gas atmosphere of Ar, $CH_4$, and He (gas flow rate ratio Ar:$CH_4$:He=10:1:65) at a gas pressure of 0.3 Pa, thereby forming the MoSiCH film (light-shielding layer).

Then, using a target of Mo:Si=4mol %:96 mol %, a film made of molybdenum, silicon, oxygen, and nitrogen (Mo: 2.6 at %, Si: 57.1 at %, O: 15.9 at %, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (front-surface antireflection layer).

The total thickness of the light-shielding film was set to 52 nm. The optical density (OD) of the light-shielding film was 3.0 at the wavelength 193 nm of ArF excimer laser exposure light.

Thereafter, a heat treatment was applied to the transparent substrate formed with the light-shielding film. Specifically, using a heating furnace, the heat treatment was carried out in the atmosphere at a heating temperature of 450° C. The contents of C and H in the MoSiCH film (light-shielding layer) of the light-shielding film did not change after the heat treatment.

In the manner described above, a binary mask blank of Example 4 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask so that the total dose became 30 kJ/$cm^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 5 nm or less. Therefore, it is seen that the binary mask blank and the binary mask of Example 4 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the ArF excimer laser irradiation, deposits due to precipitation of Mo as conventionally formed were not particularly confirmed on the transparent substrate (glass substrate) or the film.

Example 5

Example 5 is the same as Example 1 except that a MoSiON film (back-surface antireflection layer) in a light-shielding film was formed under the following conditions so that the MoSiON film (back-surface antireflection layer) was changed to a MoSiN film (back-surface antireflection layer), that the thickness and the Si content thereof were changed, and that the total thickness of the light-shielding film was changed.

Specifically, using a target of Mo:Si=4 mol %:96 mol %, a film made of molybdenum, silicon, and nitrogen (Mo: 2.3 at %, Si: 56.5 at %, N: 41.1 at %) and having a thickness of 13 nm was formed by setting the power of a DC power supply to 3.0 kW in Ar, $N_2$, and He (gas flow rate ratio Ar:$N_2$:He=6:11:16) at a gas pressure of 0.1 Pa, thereby forming the MoSiN film (back-surface antireflection layer).

Then, using a target of Mo:Si=21 mol %:79 mol %, a film made of molybdenum, silicon, carbon, and hydrogen (Mo: 19.8 at %, Si: 76.7 at %, C: 2.0 at %, H: 1.5 at %) and having a thickness of 30 nm was formed by setting the power of a DC power supply to 2.0 kW in a mixed gas atmosphere of Ar, $CH_4$, and He (gas flow rate ratio Ar:$CH_4$:He=10:1:50) at a gas pressure of 0.3 Pa, thereby forming the MoSiCH film (light-shielding layer).

Then, using a target of Mo:Si=4 mol %, a film made of molybdenum, silicon, oxygen, and nitrogen (Mo: 2.6 at %, Si: 57.1 at %, O: 15.9 at %, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (front-surface antireflection layer).

The total thickness of the light-shielding film was set to 58 nm. The optical density (OD) of the light-shielding film was 3.0 at the wavelength 193 nm of ArF excimer laser exposure light.

In the manner described above, a binary mask blank of Example 5 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask so that the total dose became 30 kJ/$cm^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 2 nm or less. Therefore, it is seen that the binary mask blank and the binary mask of Example 5 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the ArF excimer laser irradiation, deposits due to precipitation of Mo as conventionally formed were not particularly confirmed on the transparent substrate (glass substrate) or the film.

Example 6

Example 6 is the same as Example 1 except that a MoSiON film (back-surface antireflection layer) in a light-shielding film was formed under the following conditions so that the thickness and the Si content thereof were changed and that the total thickness of the light-shielding film was changed.

Specifically, using a target of Mo:Si=4 mol %:96 mol %, a film made of molybdenum, silicon, oxygen, and nitrogen (Mo: 2.6 at %, Si: 57.1 at %, O: 15.9 at %, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (back-surface antireflection layer).

Then, using a target of Mo:Si=21 mol %:79 mol %, a film made of molybdenum, silicon, carbon, and hydrogen (Mo: 19.8 at %, Si: 76.7 at %, C: 2.0 at %, H: 1.5 at %) and having a thickness of 30 nm was formed by setting the power of a DC power supply to 2.0 kW in a mixed gas atmosphere of Ar, $CH_4$, and He (gas flow rate ratio Ar:$CH_4$:He=10:1:50) at a gas pressure of 0.3 Pa, thereby forming the MoSiCH film (light-shielding layer).

Then, using a target of Mo:Si=4 mol %:96 mol %, a film made of molybdenum, silicon, oxygen, and nitrogen (Mo: 2.6 at %, Si: 57.1 at %, O: 15.9 at%, N: 24.1 at %) and having a thickness of 15 nm was formed by setting the power of a DC power supply to 3.0 kW in Ar, $O_2$, $N_2$, and He (gas flow rate ratio Ar:$O_2$:$N_2$:He=6:5:11:16) at a gas pressure of 0.1 Pa, thereby forming the MoSiON film (front-surface antireflection layer).

The total thickness of the light-shielding film was set to 60 nm. The optical density (OD) of the light-shielding film was 3.0 at the wavelength 193 nm of ArF excimer laser exposure light.

In the manner described above, a binary mask blank of Example 6 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask so that the total dose became 30 kJ/$cm^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 2 nm or less. Therefore, it is seen that the binary mask blank and the binary mask of Example 6 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the irradiation, deposits due to precipitation of Mo as conventionally formed were not particularly confirmed on the glass substrate or the film.

Example 7

Example 7 is the same as Example 1 except the following points.

With respect to a light-shielding film, a MoSiON film (back-surface antireflection layer) was not formed.

A MoSiCH film (light-shielding layer) and a MoSiON film (front-surface antireflection layer) in the light-shielding film were formed under the following conditions so that the MoSiCH film (light-shielding layer) was changed to a MoSiCHN film (light-shielding layer), that the thickness and the Si content thereof were changed, and that the thickness of the MoSiON film (front-surface antireflection layer) was changed.

The total thickness of the light-shielding film was changed. As the MoSiCHN film (light-shielding layer) in the light-shielding film, a film made of molybdenum, silicon, carbon, hydrogen, and nitrogen (Mo: 7.1 at %, Si: 71.7 at %, C: 2.0 at%, H: 1.0 at %, N: 18.2 at %) was formed to a thickness of 52 nm. As the MoSiON film (front-surface antireflection layer) in the light-shielding film, a film made of molybdenum, silicon, oxygen, and nitrogen (Mo: 2.6 at %, Si: 57.1 at %, O: 15.9 at %, N: 24.1 at %) was formed to a thickness of 8 nm.

The total thickness of the light-shielding film was set to 60 nm. The optical density (OD) of the light-shielding film was 3.0 at the wavelength 193 nm of ArF excimer laser exposure light.

In the manner described above, a binary mask blank of Example 7 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask so that the total dose became 30 kJ/$cm^2$. A section of a light-shielding film pattern after the ArF excimer laser irradiation was observed in detail using a TEM (transmission electron microscope). As a result, a modified layer as conventionally formed was not particularly confirmed and, further, an increase in line width (CD change) was suppressed to 10 nm or less. Therefore, it is seen that the binary mask blank and the binary mask of Example 7 have extremely high irradiation durability to cumulative irradiation of an exposure light source with a short wavelength of 200 nm or less.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the irradiation, deposits due to precipitation of Mo as conventionally formed were not particularly confirmed on the transparent substrate (glass substrate) or the film.

Comparative Example 1

Comparative Example 1 is the same as Example 1 except the following points.

With respect to a light-shielding film, a MoSiON film (back-surface antireflection layer) was not formed.

A MoSi film (light-shielding layer) and a MoSiON film (front-surface antireflection layer) in the light-shielding film were formed under the following conditions so that the MoSi film (light-shielding layer) was changed to a MoSiN film (light-shielding layer), that the thickness and the Si content thereof were changed, and that the thickness of the MoSiON film (front-surface antireflection layer) was changed.

The total thickness of the light-shielding film was changed.

As the MoSiN film (light-shielding layer) in the light-shielding film, a film made of molybdenum, silicon, and nitrogen (Mo: 9 at %, Si: 72.8 at %, N: 18.2 at %) was formed to a thickness of 52 nm. As the MoSiON film (front-surface antireflection layer) in the light-shielding film, a film made of molybdenum, silicon, oxygen, and nitrogen (Mo: 2.6 at %, Si: 57.1 at %, O: 15.9 at %, N: 24.1 at %) was formed to a thickness of 8 nm.

The total thickness of the light-shielding film was set to 60 nm. The optical density (OD) of the light-shielding film was 3.0 at the wavelength 193 nm of ArF excimer laser exposure light.

In the manner described above, a binary mask blank of Comparative Example 1 was manufactured.

Then, a binary mask was manufactured using this binary mask blank in the same manner as in Example 1. There was almost no change in the optical density (OD) of the light-shielding film at the wavelength 193 nm of ArF excimer laser exposure light as compared with that at the time of the manufacture of the mask blank.

An ArF excimer laser was continuously irradiated on the obtained binary mask of Comparative Example 1 so that the total dose became 30 kJ/cm$^2$. The optical density (OD) of the light-shielding film after the irradiation was measured. As a result, it was less than 3.0 at the wavelength 193 nm of ArF excimer laser exposure light and thus a reduction in optical density was observed. Further, a section of a light-shielding film pattern was observed in detail using a TEM (transmission electron microscope). As a result, a modified layer as conventionally formed was confirmed and it was also confirmed that an increase in line width (CD change) due to the modified layer was 15 nm.

The binary masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was confirmed in both cases.

Further, as a result of observing in detail a mask surface after the irradiation, deposits due to precipitation of Mo as conventionally formed were confirmed on the transparent substrate (glass substrate) or the film.

Example 8

FIG. 1 is a sectional view of a phase shift mask blank 10 of Example 8.

Using a synthetic quartz glass substrate having a 6-inch square size with a thickness of 0.25 inches as a transparent substrate 1, a light-semitransmitting film (MoSiNCH film) containing carbon and hydrogen in nitrided molybdenum and silicon was formed as a thin film 2 on the transparent substrate 1.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), methane ($CH_4$), and helium (He) (gas flow rate ratio Ar:$N_2$:$CH_4$:He=9:90:1:120) at a gas pressure of 0.3 Pa, thereby forming a MoSiNCH film made of molybdenum, silicon, nitrogen, carbon, and hydrogen and having a thickness of 69 nm. This MoSiNCH film had a transmittance of 6.11% and a phase difference of 175.6 degrees at the wavelength 193 nm of ArF excimer laser exposure light.

In the manner described above, the phase shift mask blank 10 of Example 8 was manufactured.

Then, a halftone phase shift mask was manufactured using the phase shift mask blank 10. FIG. 2 is sectional views showing processes of manufacturing the phase shift mask using the phase shift mask blank 10.

First, a chemically amplified positive resist film for electron beam writing (PRL009 manufactured by FUJIFILM Electronic Materials Co., Ltd.) was formed as a resist film 3 on the mask blank 10 (see FIG. 2, (A)). The resist film 3 was formed by spin coating using a spinner (spin coating apparatus).

Then, using an electron beam writing apparatus, a required pattern was written on the resist film 3 formed on the mask blank 10 and, thereafter, the resist film 3 was developed with a predetermined developer, thereby forming a resist pattern 3a (see FIG. 2, (B) and (C)).

Then, using the resist pattern 3a as a mask, the thin film 2 in the form of the light-semitransmitting film (MoSiNCH film) was etched, thereby forming a light-semitransmitting film pattern 2a (see FIG. 2, (D)). A mixed gas of $SF_6$ and He was used as a dry etching gas.

Then, the remaining resist pattern was stripped, thereby obtaining a phase shift mask 20 (see FIG. 2, (E)). There was almost no change in the transmittance and phase difference of the light-semitransmitting film as compared with those at the time of the manufacture of the mask blank.

An ArF excimer laser was continuously irradiated on the obtained phase shift mask so that the total dose became 30 kJ/cm$^2$. As described before, the dose of 30 kJ/cm$^2$ (energy density: about 25 mJ/cm$^2$) corresponds to the use of about 100,000 times of a photomask and corresponds to the use for about three months with a normal frequency of use of a photomask.

The transmittance and phase difference of the light-semitransmitting film (MoSiNCH film) after the ArF excimer laser irradiation were measured. As a result, the transmittance was 6.70% and the phase difference was 173.1 degrees for the ArF excimer laser. Therefore, changes before and after the irradiation were such that the change in transmittance was +0.59% and the change in phase difference was =2.5 degrees, and thus, the changes were suppressed to be small and the changes on this level do not affect the performance of the photomask.

Further, a section of the light-semitransmitting film pattern was observed in detail using a TEM (transmission electron microscope). As a result, a thick modified layer as conventionally formed was not particularly confirmed and, further, an increase in line width (CD change) was suppressed to 15 nm or less. Therefore, it is seen that the phase shift mask blank and the phase shift mask of Example 8 have extremely high irradiation durability to cumulative irradiation of an exposure light source with a short wavelength of 200 nm or less.

The phase shift masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was not confirmed in either case and thus the chemical resistance was excellent.

Further, as a result of observing in detail a mask surface after the irradiation, deposits due to precipitation of Mo as conventionally formed were not particularly confirmed on the transparent substrate (glass substrate) or the film.

Comparative Example 2

Using a synthetic quartz glass substrate having a 6-inch square size with a thickness of 0.25 inches as a transparent substrate, a light-semitransmitting film (MoSiN film) made of nitrided molybdenum and silicon was formed on the transparent substrate.

Specifically, using a mixed target of molybdenum Mo and silicon Si (Mo:Si=10 mol %:90 mol %), reactive sputtering (DC sputtering) was carried out by setting the power of a DC power supply to 3.0 kW in a mixed gas atmosphere of argon Ar, nitrogen $N_2$, and helium He (gas flow rate ratio Ar:$N_2$:He=5:49:46) at a gas pressure of 0.3 Pa, thereby forming a MoSiN film made of molybdenum, silicon, and nitrogen and having a thickness of 69 nm. This MoSiN film had a transmittance of 6.11% and a phase difference of 175.6 degrees at the wavelength 193 nm of ArF excimer laser exposure light.

In the manner described above, a phase shift mask blank of Comparative Example 2 was manufactured.

Then, a phase shift mask was manufactured using this phase shift mask blank in the same manner as in Example 8. There was almost no change in the transmittance and phase difference of the light-semitransmitting film in the manufactured phase shift mask as compared with those at the time of the manufacture of the mask blank.

An ArF excimer laser was continuously irradiated on the obtained phase shift mask of Comparative Example 2 so that the total dose became 30 kJ/$cm^2$. The transmittance and phase difference of the light-semitransmitting film (MoSiN film) after the ArF excimer laser irradiation were measured. As a result, the transmittance was 7.69% and the phase difference was 170.8 degrees for the ArF excimer laser. Therefore, changes before and after the irradiation were such that the change in transmittance was +1.58% and the change in phase difference was −4.8 degrees, and thus the changes were very large. If the changes on this level occur, the phase shift mask cannot be used any longer as a photomask. Further, a section of a light-semitransmitting film pattern was observed in detail using a TEM (transmission electron microscope). As a result, a modified layer as conventionally formed was confirmed and it was also confirmed that an increase in line width (CD change) due to the modified layer was 25 nm.

The phase shift masks were respectively immersed in an ammonia hydrogen peroxide mixture and in hot water in the same manner as in Example 1, thereby examining the chemical resistance thereof, particularly the chemical resistance (ammonia hydrogen peroxide mixture resistance, hot water resistance) of pattern side walls. As a result, corrosion of the pattern side walls was confirmed in both cases.

Further, as a result of observing in detail a mask surface after the ArF excimer laser irradiation, deposits due to precipitation of Mo as conventionally formed were confirmed on the transparent substrate (glass substrate) or the film.

Description of Symbols 1 transparent substrate
2 thin film
2' modified layer
3 resist film
10 photomask blank
20 photomask

The invention claimed is:

1. A photomask blank for use in the manufacture of a photomask adapted to be applied with exposure light having a wavelength of 200nm or less,
   wherein the photomask blank has a thin film on a transparent substrate, and
   the thin film is made of a material containing a transition metal, silicon, and hydrogen and comprising silicon hydride.

2. The photomask blank according to claim 1, wherein the thin film is a light-shielding film.

3. The photomask blank according to claim 1, wherein the thin film is a light-semitransmitting film.

4. A method of manufacturing a photomask, comprising a step of patterning, by etching, the thin film in the photomask blank according to claim 1.

5. A photomask manufactured by using the photomask blank according to claim 1.

6. The photomask blank according to claim 1, wherein the hydrogen content in the thin film is 1 to 10 at %.

7. The photomask blank according to claim 1, wherein the thin film contains Si—H bonds.

8. The photomask blank according to claim 1, wherein the transition metal comprises any one of molybdenum, tantalum, chromium, tungsten, titanium, zirconium, vanadium, niobium, nickel, and palladium or an alloy thereof.

9. The photomask blank according to claim 1, wherein a resist film is provided on the thin film.

10. A photomask blank manufacturing method for use in the manufacture of a photomask adapted to be applied with exposure light having a wavelength of 200nm or less,
    the method comprising a step of forming a thin film on a transparent substrate,
    wherein the thin film is formed by sputtering using an atmospheric gas containing hydrogen, the thin film containing a transition metal, silicon, and hydrogen and comprising silicon hydride.

11. The photomask blank manufacturing method according to claim 10, wherein the thin film is formed by adjusting the pressure of the atmospheric gas and/or the power in the sputtering.

12. The photomask blank manufacturing method according to claim 10, wherein the thin film is formed under a condition that suppresses an increase in the line width of a thin film pattern to 20nm or less, when an ArF excimer laser is continuously irradiated on a photomask manufactured using the photomask blank so that the total dose becomes 30kJ/$cm^2$.

13. The photomask according to claim 5, wherein an increase in the line width of a thin film pattern is 20nm or less, when an ArF excimer laser is continuously irradiated so that the total dose becomes 30kJ/$cm^2$.

14. A method of manufacturing a semiconductor device manufactured by using the photomask according to claim 5.

* * * * *